United States Patent
Towle et al.

(10) Patent No.: US 6,846,737 B1
(45) Date of Patent: Jan. 25, 2005

(54) PLASMA INDUCED DEPLETION OF FLUORINE FROM SURFACES OF FLUORINATED LOW-K DIELECTRIC MATERIALS

(75) Inventors: Steven Towle, Sunnyvale, CA (US); Ebrahim Andideh, Portland, OR (US); Lawrence D. Wong, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/639,625

(22) Filed: Aug. 15, 2000

(51) Int. Cl.$^7$ .......................................... H01L 21/4763
(52) U.S. Cl. ..................... 438/622; 438/626; 438/634
(58) Field of Search ............................... 438/118, 622, 438/626, 627, 634; 118/723 IR, 723 ER, 723 HE; 427/533–535

(56) References Cited

U.S. PATENT DOCUMENTS

| | | | | |
|---|---|---|---|---|
| 6,025,259 A | * | 2/2000 | Yu et al. ..................... | 438/618 |
| 6,054,398 A | * | 4/2000 | Pramanick .................. | 438/784 |
| 6,197,688 B1 | * | 3/2001 | Simpson ..................... | 438/678 |
| 6,232,217 B1 | * | 5/2001 | Ang et al. .................... | 438/624 |
| 6,245,662 B1 | * | 6/2001 | Naik et al. ................... | 438/622 |
| 6,255,217 B1 | * | 7/2001 | Agnello et al. .............. | 438/687 |
| 6,281,584 B1 | * | 8/2001 | Ngo et al. ................... | 257/758 |
| 6,284,657 B1 | * | 9/2001 | Chooi et al. ................. | 438/687 |
| 6,284,677 B1 | * | 9/2001 | Hsiao et al. ................. | 438/783 |
| 6,294,832 B1 | * | 9/2001 | Yeh et al. .................... | 257/751 |
| 6,303,518 B1 | * | 10/2001 | Tian et al. ................... | 438/758 |
| 6,372,291 B1 | | 4/2002 | Hua et al. | |
| 6,458,645 B2 | * | 10/2002 | DeBoer et al. ............. | 438/393 |
| 6,458,718 B1 | | 10/2002 | Todd | |
| 6,472,309 B1 | * | 10/2002 | Li ............................... | 438/627 |
| 6,475,856 B1 | * | 11/2002 | Yang .......................... | 438/240 |
| 2001/0042922 A1 | * | 11/2001 | Mikagi ....................... | 257/760 |
| 2002/0001952 A1 | * | 1/2002 | Chooi et al. ................. | 438/687 |

* cited by examiner

*Primary Examiner*—Eddie Lee
*Assistant Examiner*—Douglas W. Owens
(74) *Attorney, Agent, or Firm*—Cyndi M. Wheeler

(57) ABSTRACT

A low dielectric constant material having a first fluorine concentration in a near-surface portion and a second fluorine concentration in an interior portion provides an insulator suitable for use in integrated circuits. In a further aspect of the present invention, fluorine is depleted from a near-surface portion of a fluorine containing dielectric material by a reducing plasma. Fluorine in fluorinated low-k dielectric materials, such as SiOF, amorphous fluorinated carbon (a-F:C) and parylene-AF4, can react with surrounding materials such as metals and $Si_3N_4$, causing blisters and delamination. Treatment of these fluorinated low-k dielectric materials in a reducing plasma, which may be produced from precursor gases such as $H_2$ or $NH_3$, depletes the surface region of fluorine and hence reduces reaction with surrounding materials and F outgassing. By selecting an appropriate point in the integration flow, specific interfaces which are most susceptible to F-attack can be targeted for depletion.

36 Claims, 4 Drawing Sheets

| SPECIES | AS DEPOSITED (COUNTS/SECOND) | 10 SECOND EXPOSURE (COUNTS/SECOND) | 60 SECOND EXPOSURE (COUNTS/SECOND) |
|---|---|---|---|
| F | 59.16 | 12.53 | 9.98 |
| CF | 0.86 | 0.05 | 0.03 |
| $F_2$ | 1.96 | 0.11 | 0.09 |
| $CF_2$ | 0.61 | 0.04 | 0.03 |
| $CF_3$ | 0.08 | 0.07 | 0.07 |

FIG. 5

PLASMA INDUCED DEPLETION OF FLUORINE FROM SURFACES OF FLUORINATED LOW-K DIELECTRIC MATERIALS

BACKGROUND OF THE INVENTION

1. Field of the Invention

The invention relates generally to insulating layers formed between conductors in integrated circuits, and more particularly to the formation of fluorinated low-k dielectric materials.

2. Background

Advances in semiconductor manufacturing technology have led to the integration of tens, and more recently hundreds, of millions of circuit elements, such as transistors, on a single integrated circuit (IC). To achieve such dramatic increases in the density of circuit components has required semiconductor manufacturers to scale down the physical dimensions of the circuit elements, as well as the interconnection structures used to connect the circuit elements into functional circuitry.

One consequence of scaling down the physical dimensions of circuit elements has been to reduce the spacing between interconnect lines. Interconnect lines on integrated circuits are used for power and signal distribution. A dielectric material is typically disposed between the various interconnect lines on integrated circuits. Because capacitance between two conductors is a function of the spacing between those conductors, the parasitic capacitance increases as the conductors are formed closer together. It is well known that increased parasitic capacitance between signal conductors on an integrated circuit can have adverse effects such as increased power consumption, speed degradation, and signal cross-talk. One approach to reducing this parasitic capacitance is to provide dielectric materials between the interconnect lines where those dielectric materials have reduced dielectric constants.

Fluorinated dielectric materials tend to have lower dielectric constants than their unfluorinated counterparts. For example, the fluorinated oxide of silicon, SiOF, has a dielectric constant of approximately 3.6, whereas the unfluorinated silicon dioxide, $SiO_2$, has a dielectric constant of approximately 4. Similarly, fluorinating various organic dielectric materials can also reduce their corresponding dielectric constants. For example, a dielectric constant of approximately 2.4 is obtained for the fluorinated organic dielectric parylene-AF4.

Unfortunately, integration of fluorinated dielectric materials into microelectronic components has presented many serious reliability issues related to the reaction of fluorine with surrounding materials. These reactions have been found to result in blistering and in delamination. FIG. 1 shows a cross-section of a portion of an integrated circuit having a patterned layer of fluorinated dielectric. Patterned fluorinated dielectric 104 is disposed over a substrate 102. A material 110 is deposited over the patterned fluorinated dielectric 104. FIG. 1 further shows a blister 108 and a delamination 106. Both blistering and delamination are undesirable physical deformations in integrated circuits that adversely affect their reliability.

What is needed are dielectric materials having reduced dielectric constants that are suitable for integration into microelectronic components.

BRIEF DESCRIPTION OF THE DRAWINGS

FIG. 5 is a table showing experimental results obtained by time-of-flight secondary ion mass spectrometry analysis of as-deposited fluorinated low-k films, and similar films that have been processes in a reducing plasma for various lengths of time.

DETAILED DESCRIPTION

Overview

Figure 2:
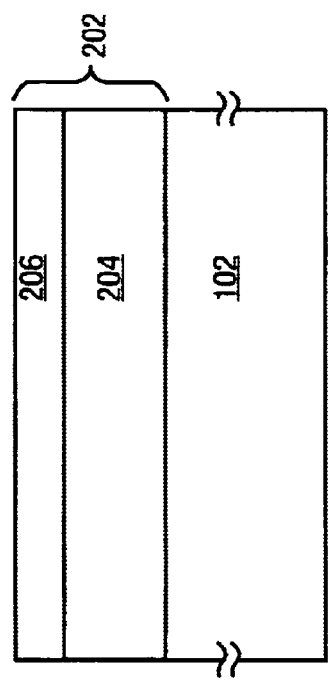
FIG. 2 is a schematic cross-section of an integrated circuit showing a blanket, or unpatterned, fluorinated low-k film having a fluorine depleted surface.
Figure 1:
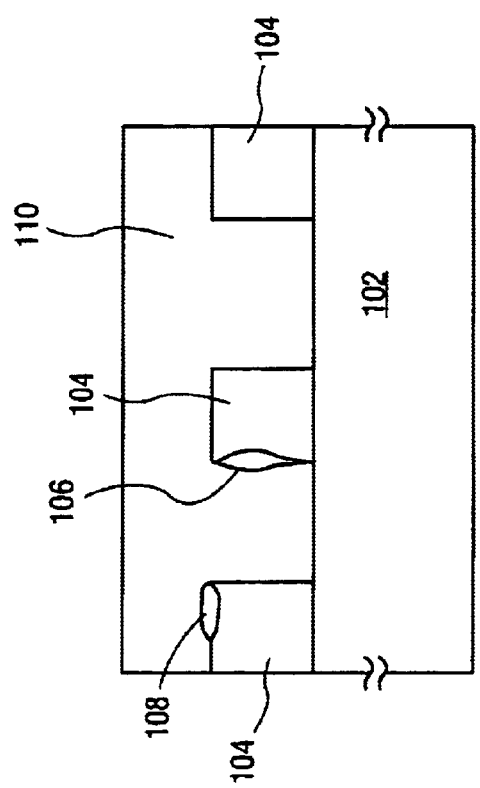
FIG. 1 is a schematic cross-section of an integrated circuit illustrating the problems of blistering and delamination in fluorinated low-k films.

Briefly, a low dielectric constant material having a first fluorine concentration in a near-surface portion and a second fluorine concentration in an interior portion provides an insulator suitable for use in integrated circuits.

In a further aspect of the present invention, fluorine is depleted from a near-surface portion of a fluorine containing dielectric material by a reducing plasma.

Fluorine in fluorinated low-k dielectric materials, such as, for example, SiOF, amorphous fluorinated carbon (a-C:F) and parylene-AF4, among others, can react with surrounding materials such as metals and $Si_3N_4$, causing blistering, peeling, and delamination. Treatment of these fluorinated low-k dielectric materials in a reducing plasma, which may be produced from precursor gases such as $H_2$ or $NH_3$, depletes the surface region of fluorine and hence lessens fluorine outgassing and lessens reactions with surrounding materials. By selecting an appropriate point in the integration flow, specific interfaces which are most susceptible to F-attack can be targeted for depletion.

Terminology

The terms, chip, integrated circuit (IC), monolithic device, semiconductor device or component, microelectronic device or component, and similar expressions are often used interchangeably in this field. The present invention is applicable to all the above as they are generally understood in the field.

The terms contact and via, both refer to structures for electrical connection of conductors from different interconnect levels. These terms are sometimes used in the art to describe both an opening in an insulator in which the structure will be completed, and the completed structure itself. For purposes of this disclosure contact and via refer to the completed structure.

The expression, low dielectric constant, refers to a dielectric constant lower than that of silicon dioxide. The expression, low-k, is alternatively used to refer to materials having a lower dielectric constant than silicon dioxide.

The expression thermal budget, refers to the sum of the high temperature operations that an integrated circuit is exposed to during the fabrication process. In essence, it is the integration of the temperature over time to which an integrated circuit is exposed to during manufacturing. Thermal budget is an important factor in designing a semiconductor manufacturing process, that is, integrating various process operations into an overall process flow.

The expressions reduce, reducing and reduction, depending on the context, can refer either to their chemical meaning, i.e., lowering the oxidation state of a chemical species or the more meaning, lessening. As used herein, the meaning will be clear from the context.

Embodiments of the present invention address the problem of blistering and delamination defects, either singularly or in combination, that are seen to occur during, and sometimes after, the integrated circuit manufacturing process when fluorinated low-k materials are incorporated into such ICs. These defects are believed to occur due to reaction of fluorine with surrounding materials such as metals and $SiO_2$, Such reactions can result in subsequent outgassing of volatile species or weakening of the interfacial bonding between materials. In many instances, these defects may be severe enough to make the use of such fluorinated low-k dielectric materials impractical in integrated circuits.

As noted above, one approach to reducing the dielectric constant of materials is to incorporate fluorine into various dielectric materials. Unfortunately, adverse results, such as blistering and delamination have been observed when integrating fluorine containing dielectrics into the process of making integrated circuits. Both blistering and delamination represent serious reliability problems for integrated circuits.

In the fabrication of integrated circuits in general, and integrated circuits using metal oxide semiconductor (MOS) field effect transistors (FETs) in particular, manufacturers seek to reduce or minimize the exposure of the transistor structures to extended high temperature processing operations because the electrical properties and characteristics of these transistors may be adversely affected. Similarly, the various metal layers that are fabricated over the transistor layers are often adversely affected by sustained exposure to high temperature operations. Because of this, the thermal budget available subsequent to the formation of fluorinated inter-layer dielectrics (ILD) is relatively small.

However, given the finite thermal budget of process operations subsequent to the formation of the fluorine containing material, the fluorine can typically only diffuse a limited distance through the material. Thus, if the surface region of a fluorinated material can be depleted of fluorine, it is possible to build structures without the appearance of defects resulting from, or related to, fluorine reactions. By depleting only the surface regions of the fluorine containing materials, and leaving the relatively high fluorine concentration in the bulk of the material, the overall dielectric constant of the material will only be slightly affected (i.e., only slightly increased).

FIG. 2 shows a schematic cross-section of a partially processed wafer in accordance with the present invention, having a fluorinated low-k dielectric layer 202 disposed on a substrate 102. Fluorinated low-k dielectric 202 has an interior portion 204 and a near-surface portion 206. Near-surface portion 206 is the fluorine depleted top surface region of dielectric 202. Interior portion 204 has a fluorine concentration which is greater than the fluorine concentration of the near-surface portion 206. Consequently, the dielectric constant of interior portion 204 is lower than the dielectric constant of near-surface portion 206. The illustration of FIG. 2 is not necessarily to scale. That is, it is desirable to have interior portion 204, which has a lower dielectric constant than near-surface portion 206, as large as possible relative to near-surface portion 206, to minimize parasitic capacitance.

Figure 3:
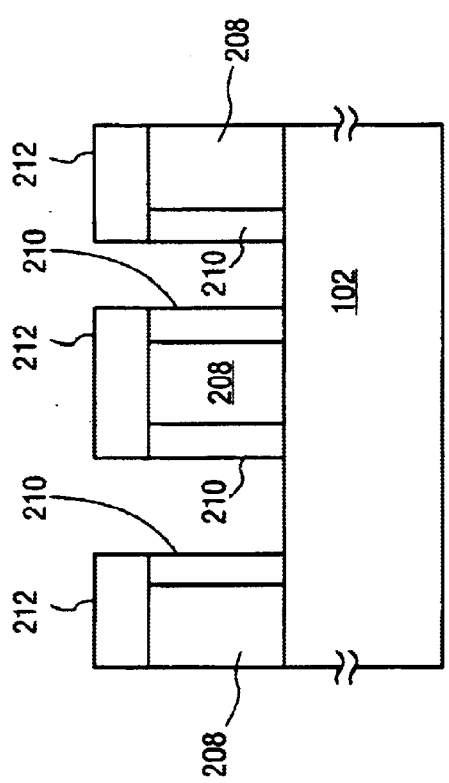
FIG. 3 is a schematic cross-section of a partially fabricated integrated circuit showing a patterned, fluorinated low-k film with a barrier layer on the top surfaces thereof and fluorine depleted sidewalls.

FIG. 3 shows a schematic cross-section of a partially processed wafer in accordance with an alternative embodiment of the present invention, having a patterned fluorinated low-k dielectric disposed on a substrate 102. The patterned fluorinated low-k dielectric has interior portions 208, and sidewalls having fluorine depleted near-surface portions 210. The patterned fluorinated low-k dielectric layer has barrier material 212 disposed on the top surfaces thereof. Barrier material 212 may be a photoresist, or a hardmask type of layer. Barrier material 212 is used to protect the top surface of the patterned fluorinated low-k dielectric from process operations that deplete fluorine from the surface of such dielectrics.

Figure 4:
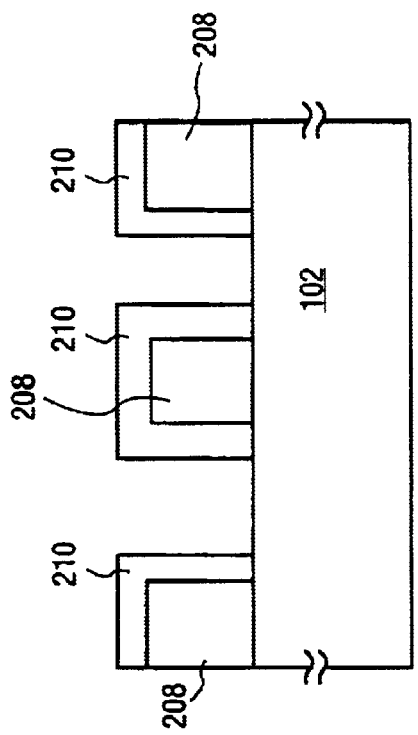
FIG. 4 is a schematic cross-section of a partially fabricated integrated circuit showing a patterned, fluorinated low-k film with fluorine depleted top surfaces and fluorine depleted sidewalls.

FIG. 4 shows a schematic cross-section of a partially processed wafer in accordance with another alternative embodiment of the present invention, having a patterned fluorinated low-k dielectric disposed on a substrate 102. In the alternative embodiment of FIG. 4, both the top surface regions and the sidewall regions have been depleted of fluorine. This results in a structure with an interior portion 208, and a near surface region 210. Interior portion 208 has a greater fluorine concentration than near surface region 210. Consequently interior portion 208 has a lower dielectric constant than near-surface portion 210. As with FIGS. 2 and 3, the size relationship of interior portion 208 to fluorine depleted portion 210 is not necessarily to scale. That is, it is desirable to have interior portion 208, which has a lower dielectric constant than near-surface portion 210, as large as possible relative to near-surface portion 210, in order to minimize parasitic capacitance.

Figure 6:
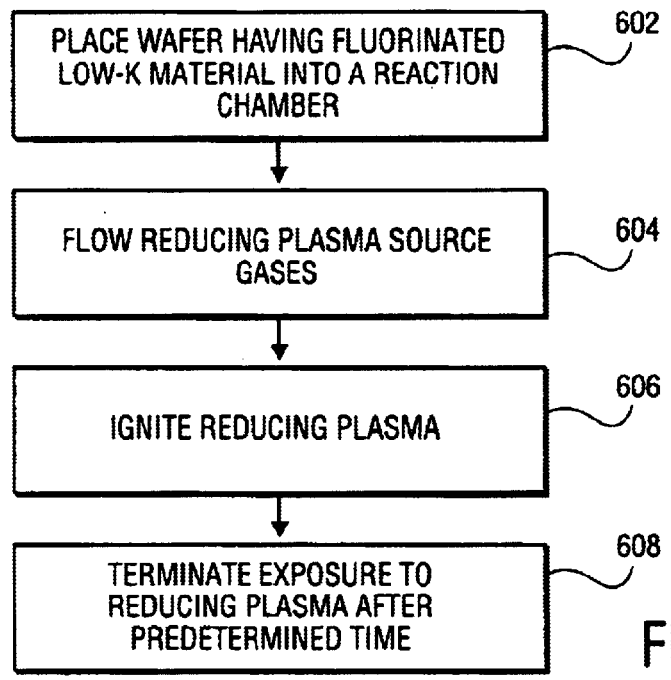
FIG. 6 is a flow diagram illustrating a process in accordance with the present invention.
Figure 7:
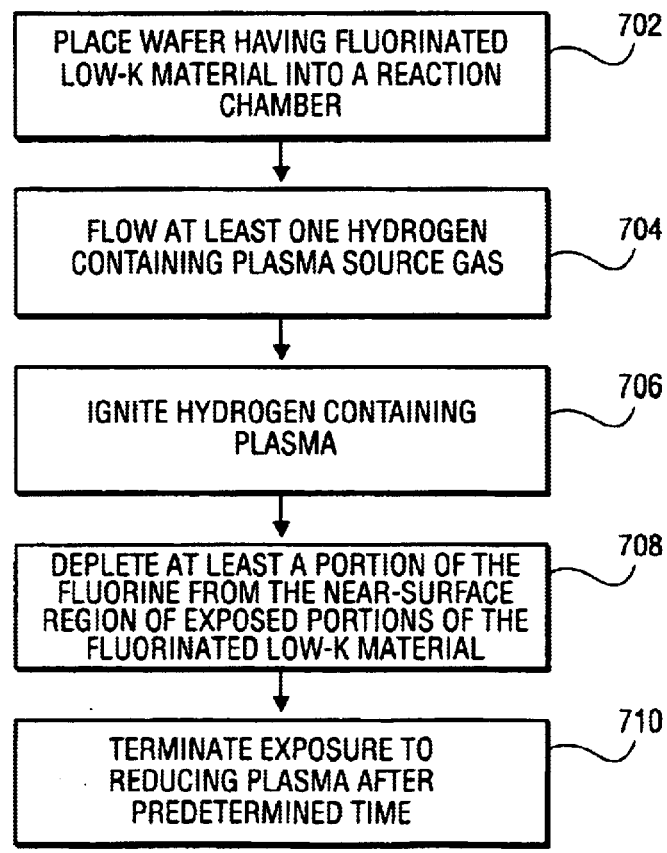
FIG. 7 is a flow diagram illustrating an alternative process in accordance with the present invention.

Illustrative processes in accordance with the present invention are described in conjunction with FIGS. 6–7.

A film of the fluorinated material is introduced into a plasma chamber with the surface to be depleted of fluorine exposed. If a blanket film is present, the top surface of that film can be depleted. If topography is present, for example sidewalls of via openings, these surfaces can be depleted without depleting the top surface by providing a photoresist or hard mask on the top surface to cover and thereby protect the top surface from fluorine depletion by the plasma. Alternatively, both the top surface and the via sidewalls may be exposed to the reducing plasma in order to deplete both of those surfaces of fluorine. In one embodiment the fluorinated film is processed at a temperature between 100° C. and 425° C. in a plasma formed in an AMAT 5000 (Applied Materials of Santa Clara, Calif.) plasma reactor with $NH_3$ flow rate between 10 sccm and 3 liters/minute, at a pressure between 1 mTorr and 50 Torr, and an RF power between 100 watts and 500 watts. It should be noted that RF power as well as other parameters will vary slightly from one type of plasma reactor to another, however.

Parylene-AF4 is a fluorinated polymer typically deposited by chemical vapor deposition (CVD). One advantage of parylene-AF4 compared to many other polymers is that it has excellent thermal stability. That is, after an initial anneal, there is typically no measurable outgassing up to 450° C. Nonetheless, it has been observed that peeling or blistering occurs at the interface between parylene-AF4 and subsequently deposited materials, especially silicon nitride, after a sustained thermal treatment (e.g., 4 hours at 425° C.). Silicon nitride is a desirable material for use as a hard mask for patterning parylene-AF4 in a damascene integration scheme. It is believed that the adhesion failures, i.e., peeling, is a result of reaction between the overlying material and fluorine in the surface of the parylene-AF4. Hydrogen plasma treatment can deplete the surface of parylene-AF4 of fluorine forming a highly cross-linked amorphous carbon surface layer while leaving the bulk material unaffected. Such a plasma may be produced with $H_2$ or $H_2$/He combination in a reactive ion etcher (RIE), PECVD system, microwave downstream plasma system, or high density plasma (HDP) system. If the hydrogen plasma treatment is performed in situ during a hardmask deposition it will produce dangling bonds which may further aid adhesion. Amorphous carbon is not a material which is currently typically used in integrated circuit processing, however it can be thermally stable if its hydrogen content is relatively low. In any case, the layer produced by plasma treatment in accordance with the present invention is relatively thin (<100 angstroms) and would be graded into the parylene-AF4 compositionally and structurally.

When a fluorinated low-k dielectric material, such as, for example SiOF, is to be used as an ILD in a damascene metal process, it is typical that a conductive material is deposited over the fluorine depleted via opening sidewalls and trenches that are commonly used in damascene processes. This conductive material is also typically a barrier to a metal such as copper. Similarly, an etch stop layer, such as, for example, silicon nitride may be deposited over a fluorine depleted surface and exhibit improved adhesion characteristics as compared to adhesion to a non-depleted surface of the fluorinated low-k dielectric material. Adhesion problems between a SiOF layer and an overlying layer arise because free fluorine trapped under the SiOF and excess fluorine on the surface of the SiOF will outgas during exposure to elevated temperatures in downstream process modules and create blisters and defects. SiN/SiOF peeling is more prevalent for SiOF materials with higher fluorine content. Depleting this fluorine from the surface portions of the SiOF may result in improved adhesions characteristics.

The plasma, in accordance with the present invention, should contain a species which will remove fluorine in a reaction such as:

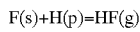

$$F(s) + H(p) = HF(g)$$

where F(s) represents free fluorine in the solid low-k film, H(p) represents H in the plasma, HF(g) represents hydrogen fluoride gas. In exemplary embodiments the plasma species would be an active form of hydrogen such as $H^+$, $H^*$, or $H^-$. Such a plasma is typically formed from an H-bearing precursor such as $H_2$ or $NH_3$, and a carrier gas such $N_2$, Ar, or He, in a parallel plate plasma system, such as a reactive ion etcher or plasma-enhanced chemical vapor deposition (PECVD) system.

An alternative approach includes using remote plasma having $H^0$ and $H^*$ as the principal reacting species. Such an alternative process in accordance with the present invention, would reduce or eliminate ion bombardment, which could allow for greater surface specificity and lower damage to the material being depleted of fluorine. The degree of surface depletion, i.e., both the extent of fluorine reduction and the depth to which it is removed, can be controlled by adjusting plasma process parameters such as the RF power and reaction time. To reduce or eliminate volatile HF remaining in the material, an additional thermal treatment operation may be added to the overall process flow.

Referring to FIG. 6, an illustrative process flow in accordance with the present invention, includes placing a wafer having a fluorinated low-k material thereon into a reaction chamber (block 602), flowing the source gases for a reducing plasma (block 604), igniting the reducing plasma (block 606), and terminating the exposure of the fluorinated low-k material to the reducing plasma after a predetermined time (block 606). The amount of time that the low-k material is to be exposed to the reducing plasma will be readily determined by those skilled in the art and having the benefit of this disclosure. Factors involved in determining plasma exposure time include plasma characteristics, the type of material to be depleted of fluorine, and the amount and depth of fluorine depletion desired and the consequent effect on the adhesion of overlying materials, after their subsequent deposition.

Referring to FIG. 7, an illustrative process flow in accordance with the present invention, includes placing a wafer having a fluorinated low-k material thereon into a reaction chamber (block 702), flowing at least one hydrogen-containing source gas for a plasma (block 704), igniting the hydrogen containing plasma (block 706), depleting at least a portion of the fluorine from the near-surface region of exposed portions of the fluorinated low-k material (block 708), and terminating the exposure of the fluorinated low-k material to the reducing plasma after a predetermined time (block 710). As discussed above in connection with the embodiment of FIG. 6, the amount of time that the low-k material is to be exposed to the reducing plasma will be readily determined by those skilled in the art and having the benefit of this disclosure. Factors involved in determining plasma exposure time include plasma characteristics, the type of material to be depleted of fluorine, and the amount and depth of fluorine depletion desired.

Experimental results have been obtained from processes embodying the present invention. In one experiment, the results of which are shown in FIG. 5, 200 mm wafers having blanket a-C:F films approximately 1 micron thick were introduced into a passivation chamber. The passivation chamber was an Applied Materials (of Santa Clara, Calif.) model 5000 PECVD passivation chamber. Data consist of time-of-flight secondary ion mass spectrometry (ToFSIMS) results (in units of counts/second) taken from wafers that were exposed for 10 seconds and 60 seconds to $NH_3$ plasma at 300 Watts, and from wafers with the as-deposited (i.e., unexposed to plasma) films. The ToFSIMS data presented in the table of FIG. 5 show that F, CF, $F_2$, $CF_2$, and $CF_3$, normalized to C concentration, have been reduced by the plasma treatment in accordance with the present invention. The results show that $NH_3$ plasma is effective in reducing the fluorine content of the film surface. The results further show that the plasma exposure time modulates the extent of the fluorine depletion.

CONCLUSION

Embodiments of the present invention provide fluorinated low-k dielectric materials having near-surface portions that have fluorine concentrations that are lower than fluorine concentrations found in the interior portions of the low-k dielectric materials.

An advantage of embodiments of the present invention is that fluorine can be used to reduce the dielectric constant of insulating materials in integrated circuits without creating reliability problems typically associated with fluorinated dielectric materials.

It will be understood by those skilled in the art that many design choices are possible within the scope of the present invention. A non-exhaustive list of such choices includes, for example, embodiments of the present invention may used with various size wafers, with wafers other than silicon, with multiple wafers in a reaction chamber, and with other fluorinated dielectric materials, such as carbon-doped SiOF, or SiOCF, fluorinated organic polymers, fluorinated siloxane polymers, and fluorinated porous materials.

It will be understood that various other changes in the details, materials, and arrangements of the parts and operations which have been described and illustrated herein may be made by those skilled in the art without departing from the principles and scope of the invention as expressed in the subjoined claims.

What is claimed is:

1. A method of forming an interlayer dielectric in an integrated circuit, comprising:
   depositing a fluorinated material on a substrate, the fluorinated material having a top surface,
   forming via openings in the fluorinated material, wherein the via openings define sidewalls;
   forming a fluorine depleted top surface and fluorine depleted sidewalls by exposing the fluorinated material to a hydrogen containing plasma in a reaction chamber, wherein the plasma is formed in a chamber remote from the reaction chamber containing the fluorinated material;
   forming a layer of a conductive material over the fluorine depleted sidewalls; and
   forming an etch stop layer over the fluorine depleted top surface.

2. The method of claim 1, wherein the fluorinated material is selected from the group consisting of a-C:F, parylene AF4, carbon-doped SiOF, fluorinated organic polymers, fluorinated siloxane polymers, and SiOF.

3. The method of claim 2, further comprising depositing a conductive material in the via openings.

4. The method of claim 2, wherein the fluorinated material comprises parylene-AF4.

5. The method of claim 1, wherein forming the etch stop layer comprises forming a layer of silicon nitride over the fluorine depicted top surfaces.

6. The method of claim 1, wherein the plasma is formed in a reaction chamber from ammonia and argon at a pressure between 1 mTorr and 50 Torr and an RF power of between 100 watts and 500 watts.

7. The method of claim 6, wherein the ammonia is passed into the reaction chamber at a flow rate in the range of 10 sccm to 3 liters/minute.

8. The method of claim 1, wherein the etch stop layer comprises silicon nitride.

9. A method of forming a dielectric, comprising:
   depositing a material on a substrate, wherein the material is selected from the group consisting of a-C:F parylene AF4, carbon-doped SiOF, fluorinated organic polymers, and fluorinated siloxane polymers, the material having a top surface;
   forming via openings in the material, wherein the via openings define sidewalls;
   forming a fluorine depleted lop surface and fluorine depleted sidewalks by exposing the material to a reducing plasma in a reaction chamber, wherein the reducing plasma is formed in a chamber remote from the chamber containing the material;
   forming a layer of a conductive material over the fluorine depleted sidewalls; and
   forming an etch stop layer over the fluorine depleted top surface.

10. The method of claim 9, further comprising depositing a conductive material in the via openings.

11. The method of claim 9, wherein the material comprises parylene-AF4.

12. The method of claim 9, wherein forming the etch stop layer comprises forming a layer of silicon nitride over the fluorine depleted top surface.

13. The method of claim 9, wherein the plasma is formed in a reaction chamber from ammonia and argon at a pressure between 1 mTorr and 50 Torr and an RF power of between 100 watts and 500 watts.

14. The method of claim 13, wherein the ammonia is passed into the reaction chamber at a flow rate in the range of 10 sccm to 3 liters/minute.

15. The method of claim 9, wherein the etch stop layer comprises silicon nitride.

16. A method or forcing a dielectric, comprising:
   forming a fluorine containing film on a substrate having a top surface,
   forming a hardmask layer on the lop surface of the fluorine containing film;
   forming via openings in the fluorine containing film, wherein the via openings define sidewalls; and
   forming fluorine depleted sidewalls by exposing the hardmask layer and the sidewalls to a reducing plasma.

17. The method of claim 16, further comprising exposing the hardmask layer and the sidewalls to the reducing plasma in a reaction chamber, wherein the reducing plasma is formed in a chamber remote from the reaction chamber containing the fluorine containing film.

18. The method of claim 16, wherein the fluorine containing film comprises a material selected from the group consisting of a-C:F, parylene AF4, carbon-doped SiOF, fluorinated organic polymers, fluorinated silicone polymers, and SiOF.

19. The method of claim 16, further comprising depositing a conductive material in the via openings.

20. The method of claim 16, wherein the plasma is formed in a reaction chamber from ammonia and argon at a pressure between 1 mTorr and 50 Torr and an RF power of between 100 watts and 500 watts.

21. The method of claim 20, wherein the ammonia is passed into the reaction chamber at a flow rate in the range of 10 sccm to 3 liters/minute.

22. A method of forming a dielectric, comprising:
   forming a fluorine containing film on a substrate, the fluorine containing film having a top surface and sidewalls:
   placing the substrate into a reaction chamber;
   forming a fluorine depleted top surface and fluorine depleted sidewalls by simultaneously exposing the top surface and sidewalls of the fluorine containing film to a reducing plasma, wherein the reducing plasma is formed in a chamber remote from the reaction chamber containing the substrate;
   forming a layer of a conductive material over the fluorine depleted sidewalls; and
   forming an etch stop layer over the fluorine depleted top surface.

23. The method of claim 22, wherein the substrate is a silicon wafer, and the fluorine containing film is a substantially planar insulating layer.

24. The method of claim 22, wherein the plasma is formed from a hydrogen bearing precursor gas and a carrier gas.

25. The method of claim 24, wherein the hydrogen bearing precursor comprises $NH_3$ gas.

26. The method of claim 25, wherein the carrier gas comprises a gas selected from the group consisting of $N_2$, Ar and He.

27. The method of claim 26, wherein the fluorine containing film comprises a material selected from the group consisting of a-C:F, parylene AF4, carbon-doped SiOF, fluorinated organic polymers, fluorinated siloxane polymers, and SiOF.

28. The method of claim 22, wherein the fluorine containing film comprises parylene-AF4.

29. The method of claim 28, wherein the etch stop layer comprises silicon nitride.

30. The method of claim 22, wherein the etch stop layer comprises silicon nitride.

31. A method of forming an inter layer dielectric in an integrated circuit, comprising:

depositing a fluorinated material on a substrate, the fluorinated material having a top surface;

forming via openings in the fluorinated material, wherein the via openings define sidewalls;

forming a fluorine depleted top surface and fluorine depleted sidewalls by simultaneously exposing the top surface and the sidewalls of the fluorinated material to a hydrogen containing plasma in a reaction chamber, wherein the plasma is formed in a chamber remote from the reaction chamber containing the fluorinated material;

forming a layer of a conductive material over the fluorine depleted sidewalls; and forming an etch stop layer over the fluorine depleted top surface.

32. The method of claim 31, wherein the fluorinated material is selected from the group consisting of a-C:F, parylene AF4, carbon-doped SiOF, fluorinated organic polymers, fluorinated siloxane polymers and SiOF.

33. The method of claim 32, further comprising depositing a conductive material in the via openings.

34. The method of claim 32, wherein the fluorinated material comprises parylene-AF4.

35. The method of claim 32, wherein the plasma is formed in a reaction chamber from ammonia and argon at a pressure between 1 mTorr and 50 Torr and an RF power of between 100 watts and 500 watts.

36. The method of claim 35, wherein the ammonia is passed into the reaction chamber at a flow rate in the range of 10 sccm to 3 liters/minute.

* * * * *

UNITED STATES PATENT AND TRADEMARK OFFICE
CERTIFICATE OF CORRECTION

PATENT NO. : 6,846,737 B1
DATED : January 25, 2005
INVENTOR(S) : Towle et al.

Page 1 of 1

It is certified that error appears in the above-identified patent and that said Letters Patent is hereby corrected as shown below:

<u>Column 5,</u>
Line 45, before "remote", insert -- a --.

<u>Column 7,</u>
Line 51, delete "lop" and insert -- top --.
Line 52, delete "sidewalks" and insert -- sidewalls --.

<u>Column 8,</u>
Line 12, delete "lop" and insert -- top --.

Signed and Sealed this

Tenth Day of May, 2005

JON W. DUDAS
*Director of the United States Patent and Trademark Office*